(12) United States Patent
Lilleland et al.

(10) Patent No.: US 6,376,385 B2
(45) Date of Patent: *Apr. 23, 2002

(54) METHOD OF MANUFACTURING ASSEMBLY FOR PLASMA REACTION CHAMBER AND USE THEREOF

(75) Inventors: John Lilleland, San Jose; Jerome S. Hubacek, Fremont; William S. Kennedy, Redwood Shores, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/790,715

(22) Filed: Feb. 23, 2001

Related U.S. Application Data

(63) Continuation of application No. 09/629,457, filed on Jul. 31, 2000, now Pat. No. 6,194,322, which is a division of application No. 09/392,265, filed on Sep. 9, 1999, now Pat. No. 6,148,765, which is a continuation of application No. 09/107,471, filed on Jun. 30, 1998, now Pat. No. 6,073,577.

(51) Int. Cl.⁷ ............................................. H01L 21/302
(52) U.S. Cl. ................... 438/710; 438/710; 156/345; 118/723 E
(58) Field of Search ................... 438/706, 710; 156/345; 118/723 E

(56) References Cited

U.S. PATENT DOCUMENTS

| | | | |
|---|---|---|---|
| 4,595,484 A | 6/1986 | Giammarco et al. | ... 204/298.33 |
| 4,792,378 A | 12/1988 | Rose et al. | ................. 438/706 |
| 4,820,371 A | 4/1989 | Rose | ........................... 156/345 |
| 4,960,488 A | 10/1990 | Law et al. | ................... 438/694 |
| 5,074,456 A | 12/1991 | Degner et al. | ............... 228/121 |
| 5,539,179 A | 7/1996 | Nozawa et al. | ........ 219/121.43 |
| 5,569,356 A | 10/1996 | Lenz et al. | .................. 438/729 |
| 5,636,098 A | 6/1997 | Salfelder et al. | ............ 361/234 |
| 5,690,795 A | 11/1997 | Rosenstein et al. | ...... 204/192.1 |
| 5,744,199 A | 4/1998 | Joffre et al. | ................. 361/234 |
| 5,777,838 A | 7/1998 | Tamagawa et al. | ......... 361/234 |
| 6,073,577 A | 6/2000 | Lilleland et al. | ......... 118/723 E |
| 6,148,765 A * | 11/2000 | Lilleland et al. | ......... 118/723 E |
| 6,194,322 B1 | 2/2001 | Lilleland et al. | ............ 438/710 |

FOREIGN PATENT DOCUMENTS

EP          0837489          4/1998

* cited by examiner

*Primary Examiner*—Robert Kunemund
*Assistant Examiner*—Lynette T. Umez-Eronini
(74) *Attorney, Agent, or Firm*—Burns, Doane, Swecker & Mathis, LLP

(57) ABSTRACT

An electrode assembly for a plasma reaction chamber wherein processing of a semiconductor substrate such as a single wafer can be carried out, a method of manufacture of the electrode assembly and a method of processing a semiconductor substrate with the assembly. The electrode assembly includes a support member such as a graphite ring, an electrode such as a silicon showerhead electrode in the form of a circular disk of uniform thickness and an elastomeric joint between the support member and the electrode. The elastomeric joint allows movement between the support member and the electrode to compensate for thermal expansion as a result of temperature cycling of the electrode assembly. The elastomeric joint can include an electrically and/or thermally conductive filler and the elastomer can be a catalyst-cured polymer which is stable at high temperatures.

14 Claims, 1 Drawing Sheet

METHOD OF MANUFACTURING ASSEMBLY FOR PLASMA REACTION CHAMBER AND USE THEREOF

This application is a continuation of application Ser. No. 09/629,457, filed Jul. 31, 2000 (now U.S. Pat. No. 6,194,322 B1), which is a divisional of application Ser. No. 09/392,265, filed Sep. 9, 1999 (now U.S. Pat, No. 6,148,765), which is a continuation of application Ser. No. 09/107,471, filed Jun. 30, 1998 (now U.S. Pat. No. 6,073,577).

BACKGROUND OF THE INVENTION

1. Field of the Invention

The invention relates to an apparatus for plasma processing of semiconductor wafers, and more particularly, to an electrode assembly wherein the electrode is bonded to a support member. The invention also relates to a process of assembling the electrode and processing of a semiconductor substrate with the electrode assembly.

2. Description of the Related Art

Electrodes used in plasma processing reactors for processing semiconductor substrates such as silicon wafers are disclosed in U.S. Pat. Nos. 5,074,456 and 5,569,356, the disclosures of which are hereby incorporated by reference. The '456 patent discloses an electrode assembly for a parallel plate reactor apparatus wherein the upper electrode is of semiconductor purity and bonded to a support frame by adhesive, solder, or brazing layer. The soldering or brazing layer can be low vapor pressure metals such as indium, silver and alloys thereof and the bonded surfaces of the support frame and the electrode can be coated with a thin layer of metal such as titanium or nickel to promote wettability and adhesion of the bonding layer. It has been found that metallurgical bonds such as In bonds cause the electrode to warp due to differential thermal expansion/contraction of the electrode and the part to which the electrode is bonded. It has also been found that these metallurgical bonds fail at high plasma processing powers due to thermal fatigue and/or melting of the bond.

Dry plasma etching, reactive ion etching, and ion milling techniques were developed in order to overcome numerous limitations associated with chemical etching of semiconductor wafers. Plasma etching, in particular, allows the vertical etch rate to be made much greater than the horizontal etch rate so that the resulting aspect ratio (i.e., the height to width ratio of the resulting notch) of the etched features can be adequately controlled. In fact, plasma etching enables very fine features with high aspect ratios to be formed in films over 1 micrometer in thickness.

During the plasma etching process, a plasma is formed above the masked surface of the wafer by adding large amounts of energy to a gas at relatively low pressure, resulting in ionizing the gas. By adjusting the electrical potential of the substrate to be etched, charged species in the plasma can be directed to impinge substantially normally upon the wafer, wherein materials in the unmasked regions of the wafer are removed.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,595,484, 4,792,378, 4,820,371, 4,960,488 disclose showerhead electrodes for distributing gas through a number of holes in the electrodes. These patents generally describe gas distribution plates having an arrangement of apertures tailored to provide a uniform flow of gas vapors to a semiconductor wafer.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$ and $SF_6$ or mixtures thereof with $O_2$, $N_2$, He or Ar is introduced into the etching chamber and maintained at a pressure which is typically in the millitorr range. The upper electrode is provided with gas holes which permit the gas to be uniformly dispersed through the electrode into the chamber. The electric field established between the anode and the cathode will dissociate the reactive gas forming a plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

A showerhead electrode 10 in an assembly for a single wafer etcher is shown in FIG. 1. Such a showerhead electrode 10 is typically used with an electrostatic chuck having a flat bottom electrode on which a wafer is supported spaced 1 to 2 cm below the electrode 10. Such chucking arrangements provide temperature control of the wafer by supplying backside He pressure which controls the rate of heat transfer between the wafer and the chuck.

The electrode assembly is a consumable part which must be replaced periodically. Because the electrode assembly is attached to a temperature-controlled member, for ease of replacement, it has been conventional to metallurgically bond the upper surface of the outer edge of the silicon electrode 10 to a graphite support ring 12 with indium which has a melting point of about 156° C. Such a low melting point limits the amount of RF power which can be applied to the electrode since the RF power absorbed by the plasma causes the electrode to heat up. The electrode 10 is a planar disk having uniform thickness from center to edge thereof. An outer flange on ring 12 is clamped by an aluminum clamping ring 16 to an aluminum temperature-controlled member 14 having water cooling channels 13. Water is circulated in the cooling channels 13 by water inlet/outlet connections 13a. A plasma confinement ring 17 comprised of a stack of spaced-apart quartz rings surrounds the outer periphery of electrode 10. The plasma confinement ring 17 is bolted to a dielectric annular ring 18 which in turn is bolted to a dielectric housing 18a. The purpose and function of confinement ring 17 is to cause a pressure differential in the reactor and increase the electrical resistance between the reaction chamber walls and the plasma thereby confining the plasma between the upper and lower electrodes. A radially inwardly extending flange of clamping ring 16 engages the outer flange of graphite support ring 12. Thus, no clamping pressure is applied directly against the exposed surface of electrode 10.

Process gas from a gas supply is supplied to electrode 10 through a central hole 20 in the temperature-controlled member 14. The gas then is distributed through one or more vertically spaced apart baffle plates 22 and passes through gas distribution holes (not shown) in the electrode 10 to evenly disperse the process gas into reaction chamber 24. In order to provide enhanced heat conduction from electrode 10 to temperature-controlled member 14, process gas can be supplied to fill open spaces between opposed surfaces of temperature-controlled member 14 and support ring 12. In addition, gas passage 27 connected to a gas passage (not shown) in the annular ring 18 or confinement ring 17 allows pressure to be monitored in the reaction chamber 24. To maintain process gas under pressure between temperature-controlled member 14 and support ring 12, a first O-ring seal 28 is provided between an inner surface of support ring 12 and an opposed surface of temperature-controlled member 14 and a second O-ring seal 29 is provided between an outer part of an upper surface of support ring 12 and an opposed surface of member 14. In order to maintain the vacuum environment in chamber 24, additional O-rings 30, 32 are provided between temperature-controlled member 14 and cylindrical member 18*b* and between cylindrical member 18*b* and housing 18*a*.

The process of bonding the silicon electrode 10 to the support ring 12 requires heating of the electrode to a bonding temperature which may cause bowing or cracking of the electrode due to the different thermal coefficients of expansion of the silicon electrode 10 and the graphite ring 12. Also, contamination of wafers could result from solder particles or vaporized solder contaminants deriving from the joint between electrode 10 and ring 12 or from the ring itself. During high-power plasma processing, the temperature of the electrode may even become high enough to melt the solder and cause part or all of the electrode 10 to separate from the ring 12. However, even if the electrode 10 becomes partly separated from ring 12, local variations in electrical and thermal power transmission between ring 12 and electrode 10 could result in nonuniform plasma density beneath the electrode 10.

SUMMARY OF THE INVENTION

The invention provides an electrode assembly for use in a plasma reaction chamber for semiconductor substrate processing. The electrode assembly includes a support member having a bonding surface, an RF driven electrode and an elastomeric joint therebetween. The electrode has an exposed surface which is intended to face the semiconductor substrate to be processed in the reaction chamber and a bonding surface at an outer edge of the electrode joined to the bonding surface of the support member by the elastomeric joint. The elastomeric joint compensates for thermal mismatch and/or thermal gradients since it allows the electrode to move relative to the support member during temperature cycling of the assembly.

According to a preferred embodiment, the electrode comprises a showerhead electrode and the electrode assembly is removably attached to a temperature-controlled member having a gas passage supplying a process gas to a backside of the showerhead electrode. In this case, the temperature-controlled member optionally can include a cavity and one or more baffle plates located in the cavity whereby the gas passage supplies process gas into the cavity to pass through the baffles and outlets of the showerhead electrode. A recess can be located in the electrode and/or the support member so as to accommodate the elastomeric joint and provide a seal which extends completely around the outer edge of the electrode. The electrode can comprise a circular silicon disk of uniform or nonuniform thickness and the elastomeric joint can comprise an electrically conductive material having an electrically conductive filler such as metal particles. The filler preferably provides direct electrical contact between the electrode and the support member.

The invention also provides a method of assembling an RF powered electrode such as a showerhead electrode useful in a plasma reaction chamber. The method includes applying an elastomeric bonding material to one or more mating surfaces of the electrode and a support member, assembling the electrode and support member and curing the bonding material to form an elastomeric joint between the electrode and support member. The mating surfaces are preferably coated with a primer which is subsequently cured and/or the bonding material is subjected to a densifying step in a vacuum environment to remove gas bubbles prior to being applied to the electrode and/or the support member. In a preferred embodiment, the elastomeric bonding material is applied to a shallow recess in a graphite support ring and a silicon electrode is pressed against the support ring during curing of the joint.

The invention also provides a method of processing a semiconductor substrate in a plasma reaction chamber. The method includes supplying a semiconductor substrate such as a wafer to the plasma reaction chamber, supplying process gas to the chamber, and processing the substrate by supplying electrical power to an electrode assembly. The electrode assembly includes an electrode and a support member and the electrical power passes to the electrode through an elastomeric joint which bonds the electrode to the support member such that the electrode moves relative to the support member during temperature cycling of the assembly. The electrode can be a showerhead electrode and the process gas can be supplied to the chamber through a gas passage in a temperature-controlled member mounted in the plasma reaction chamber such that the process gas passes through an exposed surface of the showerhead electrode. The support member can be a graphite ring removably attached to the temperature-controlled member and the electrode can be a silicon disc joined to the graphite ring solely by the elastomeric joint.

BRIEF DESCRIPTION OF THE DRAWINGS

The invention will now be further described with reference to the figures, wherein.

DETAILED DESCRIPTION OF THE INVENTION

Figure 1:
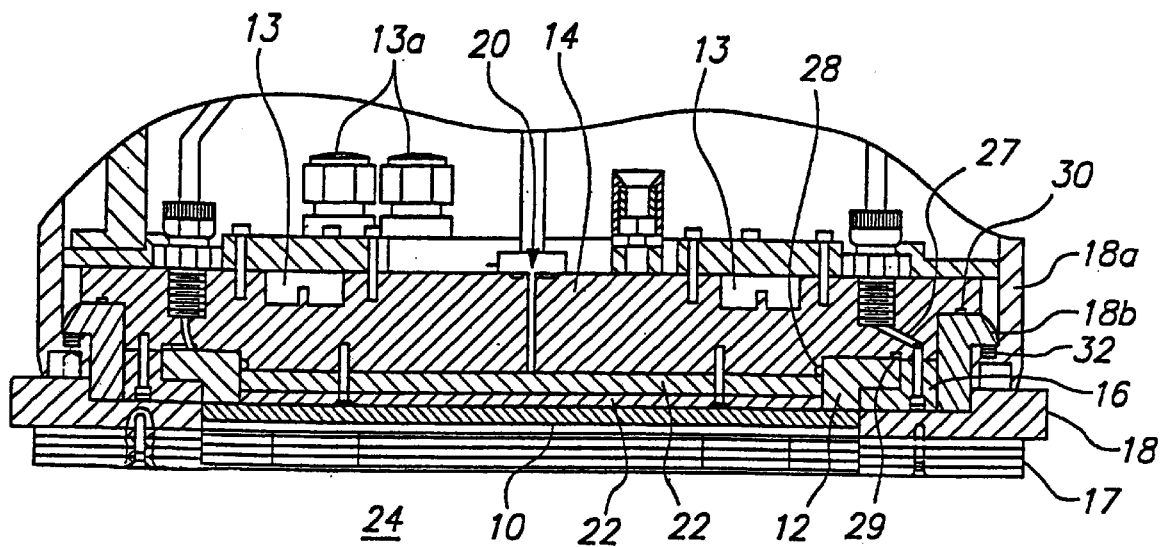
FIG. 1 is a side sectional view of a prior art showerhead electrode assembly for single wafer processing.

The electrode assembly of the invention overcomes disadvantages of the prior art electrode assembly shown in FIG. 1 by providing better accommodation of stresses due to thermal mismatch between the electrode and support member which prolongs the life of the electrode, allowing the electrode to be exposed to higher temperatures which allows the reactor to be run at higher power, lowering the cost of production and assembly of the electrode, and providing a greater degree of flatness from the center to the outer periphery of the electrode during operation of the reactor which allows uniform plasma processing of semiconductor substrates. The plasma processing includes etching of materials such as oxide layers, stripping of materials such as photoresists, deposition of layers such as SiO$_2$, etc. The primary benefits of the invention, however, are the reduction in stress in the electrode assembly due to mismatch of coefficients of thermal expansion and/or thermal gradients of the electrode components and allowing higher power operation of the plasma reactor.

A showerhead electrode assembly according to the present invention includes an electrode, a support member, and an elastomeric joint for resiliently bonding the electrode to the support member. Thus, the invention avoids the need for solder bonding the electrode to a supporting ring which can lead to the various disadvantages discussed above with respect to the arrangement shown in FIG. 1.

Because the electrode assembly is a consumable part which must be periodically replaced, the electrode is preferably bonded to a support member in the form of a ring which can be mechanically clamped to a permanent part of the reactor. For instance, the ring of the electrode assembly can be removably attached to a temperature-controlled member having a gas passage for providing process gas (e.g., a suitable plasma etching gas for etching silicon dioxide or other layer of material on the wafer) which passes into a cavity containing baffle plates and outwardly through outlets in the electrode. If desired, however, the electrode assembly can have other arrangements wherein the electrode is not a showerhead electrode and/or the support member is not in the form of a ring. For instance, the electrode could be a showerhead electrode bonded to a backing plate having gas distribution holes communicating with those in the electrode. Another possibility is where the electrode is bonded to a support member in the form of a plate, cylinder, projections on a base member, etc.

According to the preferred embodiment of the invention, the support member is in the form of a ring having a radially outwardly extending flange at one edge thereof for removably attaching the electrode assembly to a temperature-controlled member located in the interior of a plasma reaction chamber such as the type used for single wafer plasma etching. In the assembled condition, cooling channels in the upper surface of the temperature-controlled member can provide water cooling of the electrode assembly.

The electrode preferably consists of an electrically conductive material such as a planar silicon (e.g., single crystal silicon), graphite or silicon carbide electrode disc having uniform thickness from the center to the outer edge thereof. However, electrodes having nonuniform thickness, different materials and/or without process gas distribution holes could also be used with the electrode assembly according to the invention. In a preferred embodiment, the electrode is a showerhead electrode provided with a plurality of spaced apart gas discharge passages which are of a size and distribution suitable for supplying a process gas which is energized by the electrode and forms a plasma in the reaction chamber beneath the electrode. However, any type of electrode useful in a plasma reactor or vacuum environment can be used as part of the electrode assembly according to the invention, such electrodes including sputter electrodes.

The elastomeric joint can comprise any suitable elastomeric material such as a polymer material compatible with a vacuum environment and resistant to thermal degradation at high temperatures such as above 200° C. The elastomer material can optionally include a filler of electrically and/or thermally conductive particles or other shaped filler such as wire mesh, woven or non-woven conductive fabric, etc.

Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber. Examples of high purity elastomeric materials include one-component room temperature curing adhesives available from General Electric as RTV 133 and RTV 167, a one-component flowable heat-curable (e,g. over 100° C.) adhesive available from General Electric as TSE 3221, and a two-part addition cure elastomer available from Dow Corning as "SILASTIC." An especially preferred elastomer is a polydimethylsiloxane containing elastomer such as a catalyst cured, e.g. Pt-cured, elastomer available from Rhodia as V217, an elastomer stable at temperatures of 250° C. and higher.

In the case where the elastomer is an electrically conductive elastomer, the electrically conductive filler material can comprise particles of a an electrically conductive metal or metal alloy. A preferred metal for use in the impurity sensitive environment of a plasma reaction chamber is an aluminum alloy such as a 5–20 weight % silicon containing aluminum base alloy. For example, the aluminum alloy can include about 15 wt % silicon.

In order to stay within the elastic limits of the finally formed joint, it has been found useful to provide one or more recesses in at least one of the members to be attached. That is, too thin of a joint could tear during thermal cycling whereas too thick a joint could affect electrical power transmission and/or thermal coupling between the parts to be joined. In the case of attaching a silicon electrode to a graphite support ring, a recess can be provided in the graphite ring for purposes of maintaining a thin enough layer of elastomer between the electrode and support ring to provide adequate electrical coupling yet thick enough to accommodate thermal mismatch between the electrode and support ring. As an example, in the case of a thermally conductive elastomer having a filler content of about 45 to 55 volume % and an average filler particle size of 0.7 to 2 $\mu$m, the recess can have a depth of about 2 mils (about 50 $\mu$m). In contact areas surrounding the recess, the elastomer is thin enough to provide higher electrical conductivity than exhibited by the bulk elastomer because individual particles bridge the opposed contact surfaces. In addition, the combination of suitably sized particles and groove depth allows the passage of RF current through the joint. If the filler content is increased to above 65 to 70 volume % for providing a better DC path through the joint, such high filler contents could adversely affect the elasticity of the joint. However, it is not necessary to use an electrically and/or thermally conductive elastomer since sufficient RF power can be supplied to the electrode through a thin area of the elastomeric joint due to capacitive coupling between the electrode and the support member. Such a thin joint also provides adequate thermal conductivity between the electrode and the support member.

The mating surfaces of the electrode and support member can be planar or non-planar. For instance, one mating surface can be planar and the other can include a recess for receiving the bonding material as described above. Alternatively, the mating surfaces can be contoured to provide an interlocking and/or self-aligning arrangement. In order to enhance adhesion of the elastomeric bonding material, the mating surfaces are preferably coated with a suitable primer. If the bonding material is the V217 material described above, the primer can be a siloxane in an aliphatic solvent such as Rhodia's VI-SIL V-06C.

The primer can be applied as a thin coating by any suitable technique such as wiping, brushing, spraying, etc. to create bonding sites on the mating surfaces for the later applied bonding material. If the primer contains a solvent, application of the primer by wiping can enhance bonding by cleaning the mating surfaces. A siloxane containing primer reacts with air and creates Si bonding sites when cured in air at room temperature. Such primers provide a visual indication of the amount of bonding sites with excessive primer locations appearing powdery. Although the primer provides an easy and effective technique for conditioning the mating surfaces, other conditioning techniques such as treating the surfaces in an oxygen plasma can be used.

In order to provide a good quality elastomeric joint, it is desirable to densify the elastomer bonding material prior to applying it to the mating surfaces. For example, the elastomer bonding material can be subjected to vibration in a vacuum environment at ambient or elevated temperature. A vacuum pressure below 1 Torr, preferably below 500 mTorr can be used to degas the bonding material. The vacuum can be pulsed by venting one or more times during the densifying treatment to enhance breakup of bubbles generated by the vacuum. As an example, a vacuum of about 200 mTorr can be pulsed 4 or 5 times over a 30 minute period of time. The presence of filler in the elastomeric bonding material also aids in breaking up the bubbles formed in the vacuum. Without the agitation/pulsed vacuum, the elastomer bonding material expands under vacuum to about 10 times its starting volume, thus creating storage and cleanup problems which can introduce new air pockets into the material. Such gas sites could form bubbles during curing of the bonding material, thus degrading the finally formed joint.

Masking of the mating surfaces provides a useful way of protecting the surrounding surfaces and removing excess bonding material after the joint is formed. For the highly pure materials used as components of plasma reactors, polyester and/or polyimide materials such as MYRLAR and KAPTON tapes having silicon/graphite compatible adhesive can be used. In the case of a silicon showerhead electrode, it is desirable to cover the gas outlets on the electrode with MYLAR tape and the outside edge of the electrode can be covered with a strip of KAPTON tape. In the case of a graphite support ring, the inner and outer edges can be covered with strips of KAPTON tape. In order to aid removal of excess bonding material after the joint is formed, it is useful to apply primer to the masking material to promote sticking of the elastomer bonding material thereto. In this way, when the masking material is removed from the bonded parts, the excess bonding material adhered to the masking material is also removed.

The elastomeric bonding material can be applied to one or both of the mating surfaces. In the case of a silicon electrode and graphite support ring, it is desirable to apply the bonding material to the graphite support ring because it is more porous. For example, a bead of the bonding material can be applied into a recess extending completely around the support ring. The amount of the bonding material preferably exceeds the volume of the finally formed joint. As an example, the bonding material can be applied in an amount of about 5 times the amount needed to form the joint.

After the bonding material is applied to at least one of the mating surfaces, the bonding material can be subjected to a densifying step. For instance, the graphite ring with the bonding material applied thereto can be placed in a vacuum environment as described earlier to remove gas bubbles introduced during the step of applying the bonding material.

After the bonding material is applied to at least one of the mating surfaces, the parts can be assembled such that the mating surfaces are pressed together. In the case of the electrode and support ring described above, the electrode can be held in a fixture and plastic pins of the fixture can be used to guide the support ring into precise contact with the electrode. Initially, slight pressure such as hand pressure can be used to spread the elastomer throughout the joint to be formed. After the elastomer is spread, a static load such as a 30 pound weight can be applied to the electrode during curing of the bond.

The bond can be cured at ambient or elevated temperature in an atmospheric or protective gas environment. For example, the assembly can be placed in a convection oven and heated to a low temperature to accelerate curing of the bond without inducing thermal strains into the parts to be joined. In the case of the electrode and support ring described above, it is desirable to maintain the temperature below 60° C., e.g. 45 to 50° C. for a suitable time, e.g. 3 to 5 hours.

After the bond is cured to form the elastomeric joint, the assembly is cooled and the masking material is removed. Further, any additional cleanup and/or further manufacturing steps such as outgassing in a vacuum oven can be carried out depending on the requirements of the assembly operation.

Figure 2:
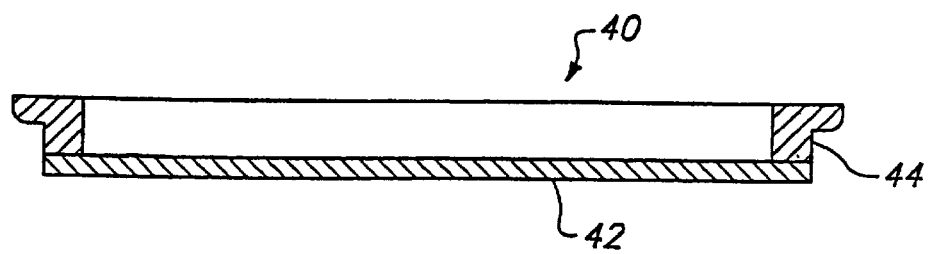
FIG. 2 is a side sectional view of a showerhead electrode assembly according to one embodiment of the present invention.
Figure 3:
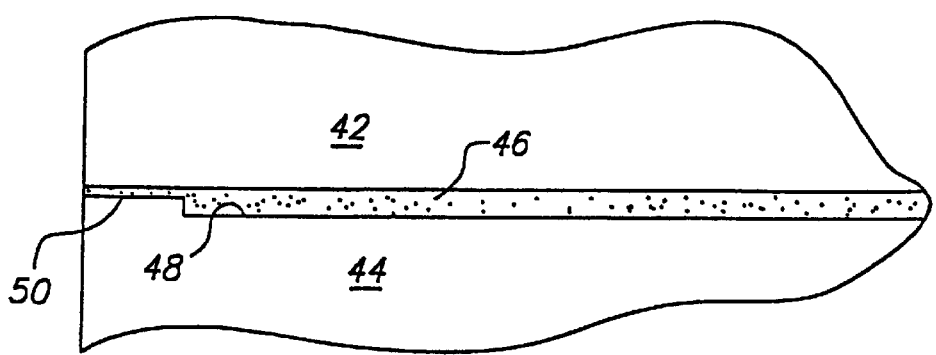
FIG. 3 is a side sectional view of a portion of the arrangement shown in FIG. 2.

FIG. 2 shows a showerhead electrode arrangement 40 in accordance with one embodiment of the invention. The electrode arrangement 40 includes an electrode 42 and an electrically conductive support ring 44. The electrode assembly can be substituted for the electrode assembly constituted by electrode 10 and support ring 12 shown in FIG. 1. The electrode 40 differs from the In-bonded assembly shown in FIG. 1 in that the electrode 42 is bonded to the support ring 44 by an elastomeric joint 46 which can be located in a recess 48, as shown in FIG. 3.

In accordance with an embodiment of the invention, the recess 48 extends continuously around the support ring 44 between an inner wall (not shown) and an outer wall 50 of the support ring 44. Each wall 50 can be as thin as possible, e.g. about 30 mils wide, which allows the elastomer to form a thin layer (e.g. about 2 $\mu$m thick in the case where the elastomer includes 0.7 to 2 $\mu$m sized filler) in the area in contact with each wall 50 and a thicker layer (e.g. about 0.0025 inch) in the recess 48. The recess formed by the walls can be extremely shallow, e.g. about 2 mils deep, which provides a very thin elastomeric joint having enough strength to adhesively bond the electrode to the support ring yet allow movement of the electrode relative to the support ring during temperature cycling of the electrode assembly. Additionally, the walls of the recess can protect the elastomeric joint from attack by the plasma environment in the reactor.

The electrode assembly dimensions can be adapted to meet the demands of the intended use of the electrode assembly. As an example, if the electrode is used to process an 8 inch wafer, the electrode can have a diameter slightly less than 9 inches and the support ring can have a width at the interface between the electrode and the support ring slightly less than 0.5 inch. For example, the support ring at the interface can have an inner diameter of 8 inches and an outer diameter at the interface of 8.8 inches. In such a case, the interface between the electrode and support ring can have a width of about 0.4 inch and the recess can have a width of 0.34 inch if the walls are 0.030 inch wide.

While a specific example of a joint has been described, other elastomeric joints can be utilized to attach the electrode to a support member in the form of a support ring or other configuration provided that the joint has sufficient strength under the elevated temperature and plasma conditions experienced in a plasma reactor environment. The elastomeric joint preferably is vacuum compatible, has sufficient toughness, tear strength, elasticity, resistance to thermal degradation, thermal conductivity and/or electrical conductivity. In the case where the electrode is a showerhead electrode, the elastomeric joint must be able to withstand the weight of the electrode and gas pressure of the process gas supplied to the showerhead electrode.

According to the invention, use of an elastomer material to attach the electrode to the support ring offers advantages compared to indium bonded electrodes with respect to reduced likelihood of breakage of electrode, reduced likelihood of debonding of electrode from support ring due to thermal fatigue, reduced distortion and thus improved thermal contact between the support ring and the temperature-controlled member during temperature cycling of the electrode assembly, improved electrical power supply to the electrode by maintaining good capacitive coupling/electrical contact between electrode and support ring, reduced chamber contamination from particles or impurities and/or increased power capability due to the ability of the electrode assembly to withstand higher temperatures.

The apparatus according to the invention is useful for wafer processing such as plasma etching, deposition, etc., in multiple or single wafer processing. For instance, the apparatus can be used for etching or depositing BPSG, oxides such as thermal silicon dioxide or pyrolytic oxides and photoresist materials. The apparatus can maintain desirable levels of submicron contact profile, CDs and low particle contamination. With respect to etching BPSG, etch rates of about 8000 Å/min can be achieved and etch uniformity can be maintained at around 4% for electrode lifetimes of greater than 30,000 RF minutes, whereas In-bonded electrode assemblies may require replacement as early as 2400 RF minutes. Photoresist etch rates of about 800 Å/min can be maintained while etching silicon dioxide at about 6000 Å/min. With respect to CD line measurement, measurements by SEM of wafers etched for 200 seconds to provide vias in silicon dioxide can provide center and edge CDs less than 0.02 $\mu$m.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of manufacturing an assembly for use in a plasma reaction chamber, comprising:

applying an elastomeric bonding material to one or more mating surfaces of a first member and a second member;

forming an assembly of the first member and the second member such that the elastomeric bonding material joins the mating surfaces of the first member and the second member; and curing the elastomeric bonding material so as to form an elastomeric joint between the first member and the second member, the elastomeric joint allowing movement of the first member relative to the second member during temperature cycling thereof.

2. The method of claim 1, further comprising preparing the elastomeric bonding material by mixing at least two components of an elastomer with an optional electrically conductive filler and densifying the elastomeric bonding material in a vacuum environment at ambient or a temperature above or below ambient.

3. The method of claim 1, further comprising applying masking material to surfaces of the first member and the second member so as to leave the mating surfaces exposed and optionally coating exposed portions of the masking material with a primer material which removes excess elastomeric bonding material squeezed out of the elastomeric joint when the masking material is removed from the first member and the second member.

4. The method of claim 1, wherein the first member includes a recess, the elastomeric bonding material being applied in an amount such that the elastomeric joint fills the recess and is thin enough to conduct heat between the first and second members.

5. The method of claim 1, wherein the elastomeric bonding material includes an electrically conductive filler, the elastomeric bonding material being applied to the mating surfaces so as to provide substantially direct electrical contact between the first and second members.

6. The method of claim 1, wherein the first member comprises silicon and the second member comprises graphite, the silicon being bonded to the graphite solely by the elastomeric joint.

7. The method of claim 1, wherein the method includes aligning the first and second members in a fixture, applying pressure sufficient to force excess bonding material outwardly of an interface between the first and second members, heating the assembly in an oven at a temperature high enough to accelerate curing of the elastomeric bonding material but low enough to minimize thermal expansion of the first and second members.

8. The method of claim 1, wherein the elastomeric bonding material is filled into a recess sized to provide a cured elastomeric joint which allows sufficient movement between the first and second members to prevent tearing of the joint as a result of differential thermal expansion or contraction of the first and second members during use of the assembly in a plasma reactor.

9. The method of claim 1, wherein the elastomeric bonding material has a viscosity sufficient to achieve self-leveling and spreading of the bonding material on the mating surfaces, the method further comprising degassing the bonding material by placing the assembly in a vacuum environment.

10. The method of claim 1, further comprising applying a primer material to the mating surfaces or plasma treating the mating surfaces.

11. A method of processing a semiconductor substrate in a plasma reaction chamber wherein an assembly includes a first member bonded to a second member by an elastomeric joint, comprising:

supplying a semiconductor substrate to the plasma reaction chamber;

supplying process gas to an interior of the plasma reaction chamber;

energizing the process gas to form a plasma used to process an exposed surface of the semiconductor substrate, the elastomeric joint allowing the first and second members to move relative to each other during temperature cycling of the assembly.

12. The method of claim 11, wherein the semiconductor substrate comprises a silicon wafer and the method includes etching a dielectric or conductive layer of material on the wafer.

13. The method of claim 11, wherein the method includes depositing a layer of material on the semiconductor substrate.

14. The method of claim 11, wherein the the first member comprises an electrode and the second member comprises a temperature-controlled member.

* * * * *